United States Patent [19]

Tupman

[11] Patent Number: 4,683,373
[45] Date of Patent: Jul. 28, 1987

[54] OPTICAL SEAT SWITCH
[75] Inventor: David J. Tupman, Mentor, Ohio
[73] Assignee: Caterpillar Industrial Inc., Mentor, Ohio
[21] Appl. No.: 921,892
[22] Filed: Oct. 23, 1986

Related U.S. Application Data

[63] Continuation of Ser. No. 773,142, Sep. 5, 1985, abandoned.

[51] Int. Cl.$^4$ .............. H01J 40/14; B60K 28/04
[52] U.S. Cl. .................................. 250/221; 340/556; 180/272
[58] Field of Search ............ 250/221; 340/556; 180/272

[56] References Cited

U.S. PATENT DOCUMENTS 2,151,639 3/1939 Golden ............... 180/272 X
3,764,861 10/1973 Orris ................. 331/108 D

FOREIGN PATENT DOCUMENTS 3123829 2/1982 Fed. Rep. of Germany .
3118838 12/1982 Fed. Rep. of Germany .
2088557 5/1971 France .
0146880 9/1983 Japan .

Primary Examiner—Eugene R. LaRoche
Assistant Examiner—David Mis
Attorney, Agent, or Firm—Stephen L. Noe

[57] ABSTRACT

Seat switches for detecting the presence and absence of an occupant in the seat of a vehicle are commonly used on industrial and commercial vehicles. It is desirable that the control signal produced by such seat switches be responsive only to the presence and absence of the vehicle occupant, and be relatively simple, rugged, and inexpensive. The instant invention includes an emitting device for directing a source of coded radiant energy across a vehicle seat, and a detecting device for receiving radiant energy, including a portion of the coded radiant energy in response to the seat being vacant. The detecting device produces an electrical signal in response to the received radiant energy. An electrical circuit produces a control signal only in response to the detecting device receiving the coded radiant energy.

8 Claims, 5 Drawing Figures

OPTICAL SEAT SWITCH

This is a continuation of Ser. No. 773,142, filed Sept. 5, 1985, now abandoned.

TECHNICAL FIELD

This invention relates generally to an apparatus and method for detecting the presence of an occupant in the seat of a vehicle, and, more particularly, to an apparatus and method for producing a control signal in response to the presence and absence of an occupant in the seat of the vehicle.

BACKGROUND ART

For a variety of reasons, it is often necessary to detect the presence and absence of an occupant in the seat of a vehicle. For example, in the case of an industrial vehicle such as a lift truck, it is common practice to disable the lift truck operating system except when an operator is sitting in the lift truck seat.

Various methods of sensing the presence and absence of an occupant in the seat of a vehicle have been proposed in the past. In the simplest designs, a mechanical switch is embedded in the seat cushion, or is otherwise mechanically linked to motion of the seat. The mechanical switch produces a signal in response to a predetermined amount of weight placed on the vehicle seat. In a more complex arrangement, U.S. Pat. No. 3,764,861, filed on July 31, 1972, and issued to Stephen J. Orris, discloses an electronic detection device. A capacitive switch is placed within the cushion of a vehicle seat, and produces a signal in response to a sensed shift in capacitance caused by the presence of an object on the vehicle seat.

Although various seat switches, such as those described above, have been proposed in the past, none have been found to be fully satisfactory. Such prior seat switches are subject to damage, especially owing to repetitive flexing of the sensing elements caused by the weight of the occupant of the vehicle seat, and exacerbated by vibration of the vehicle. In the case of electronic sensors, many are excessively complex and subject to failure when operated in an industrial environment. Additionally, most sensing devices located within or attached to the vehicle seat can be inadvertently operated by placing an object on the seat which is of sufficient mass to trigger the sensing mechanism.

The present invention is directed to overcoming one or more of the problems as set forth above.

DISCLOSURE OF THE INVENTION

In one aspect of the present invention, an apparatus for producing a control signal in response to the presence and absence of an occupant in the seat of a vehicle is provided. A radiant energy emitting device directs a source of coded radiant energy across the vehicle seat. A radiant energy detecting device receives radiant energy impinging upon it, including a portion of the coded radiant energy from the emitting device when the seat is unoccupied, and produces an electrical signal in response to the received radiant energy. A discriminating circuit distinguishes the electrical signal produced in response to the detecting device receiving coded radiant energy, from electrical signals produced in response to the detecting device receiving spurious uncoded radiant energy. An electrical circuit produces the control signal only in response to the detecting device receiving the coded radiant energy.

In a second aspect of the present invention, a method for producing a control signal in response to the presence and absence of an occupant in the seat of the vehicle is provided. The method includes the steps of directing a source of coded radiant energy across the vehicle seat, and receiving radiant energy that includes a portion of the coded radiant energy in response to the seat being vacant. The electrical signal produced in response to detecting the coded radiant energy is distinguished from electrical signals produced in response to detecting spurious uncoded radiant energy. A control signal is produced only in response to receiving the coded electrical signal.

BRIEF DESCRIPTION OF THE DRAWINGS

For a better understanding of the present invention, reference may be made to the accompanying drawings, in which.

BEST MODE FOR CARRYING OUT THE INVENTION

Figure 2:
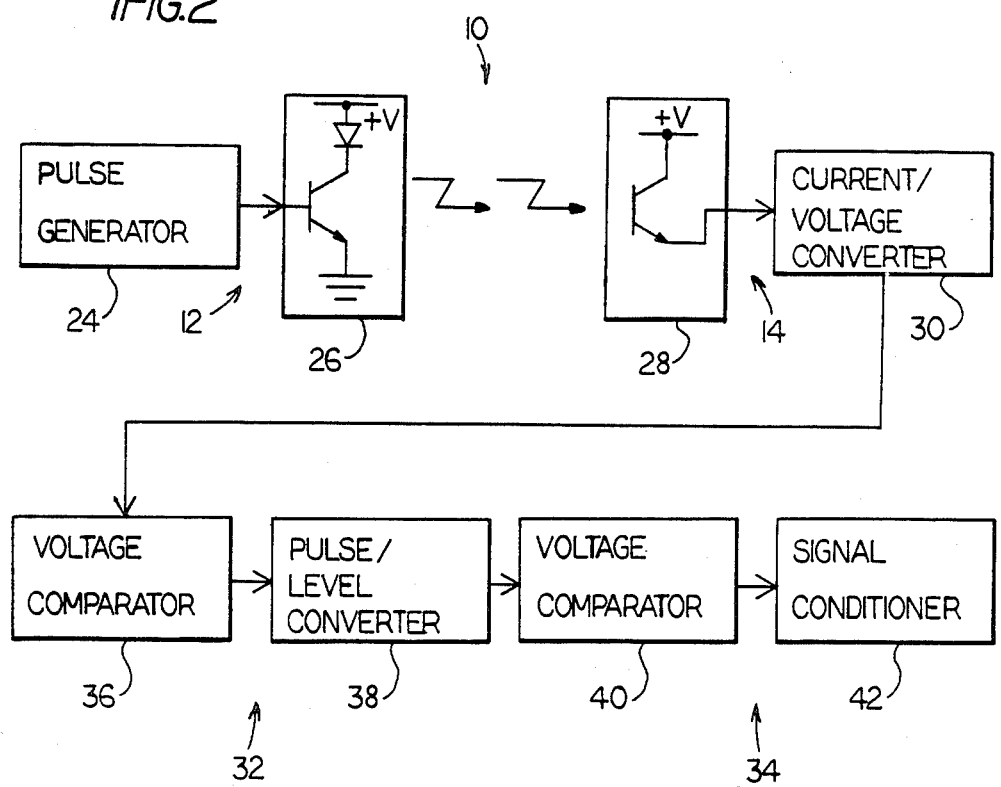
FIG. 2 is a block diagram of an embodiment of the present invention.

Referring first to FIG. 2, an apparatus embodying certain of the principles of the present invention is generally indicated by the reference numeral 10. It should be understood that the following detailed description relates to the best presently known embodiment of the apparatus 10. However, the apparatus 10 can assume numerous other embodiments, as will become apparent to those skilled in the art, without departing from the appended claims.

Figure 1:
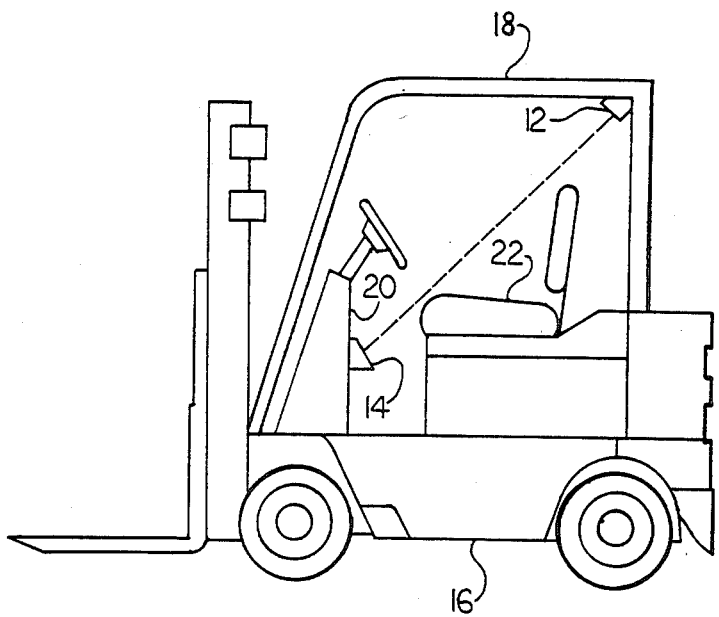
FIG. 1 is a side elevational view of a vehicle incorporating the one embodiment of the present invention.

The apparatus 10 includes emitting means 12 and detecting means 14. Referring temporarily to FIG. 1, a vehicle 16, for example, an industrial vehicle such as a lift truck having an overhead guard 18, a steering console 20, and a vehicle seat 22, includes the emitting means 12 and the detecting means 14. The emitting means 12 is attached to the overhead guard 18 and positioned to direct a source of coded radiant energy across the vehicle seat 22. The detecting means 14 is attached to the console 20 and positioned to receive radiant energy, including a portion of the coded radiant energy from the emitting means 12 so long as a line of sight is available between the emitting means 12 and the detecting means 14. In other words, so long as the vehicle seat 22 is unoccupied, the emitting means 12 and detecting means 14 are in optical communication with one another. It is recognized that reversal of the position of the emitting and detecting means is of no particular significance in the arrangement shown in FIG. 1.

Adverting now to FIG. 2, the emitting means 12 includes a pulse generator means 24 for substantially continuously producing a series of current pulses having a predetermined frequency and duty cycle, and an infrared light emitting diode 26 connected to the pulse generator means 24 and adapted to produce radiant energy having a wave length substantially within the infrared spectrum, in response to receiving each of the produced current pulses.

The detector means 14 includes a phototransistor 28 adapted to produce a current signal in response to receiving radiant energy, and a current-to-voltage converter means 30 for receiving the current signal from the phototransistor 28 and responsively producing a voltage signal. The current-to-voltage converter means 30 is connected to the phototransistor 28.

The apparatus 10 includes discriminating means 32 for distinguishing the electrical signal produced in response to the detecting means 14 receiving the coded radiant energy, from electrical signals produced in response to the detecting means 14 receiving spurious uncoded radiant energy, and circuit means 34 for producing a control signal only in response to the detecting means 14 receiving the coded radiant energy. The discriminating means 32 includes a first voltage comparator means 36 for receiving the voltage signal, comparing the voltage signal with a first predetermined voltage reference signal, and producing a comparison signal in response to the voltage signal having a magnitude exceeding the magnitude of the first predetermined voltage reference signal. The discriminating means 32 also includes a pulse-to-level converter means 38 for receiving the comparison signal and producing a voltage level signal in response to the received comparison signal.

The circuit means 34 includes a second voltage comparator means 40 for receiving the voltage level signal, comparing the voltage level signal with a second predetermined voltage reference signal, and producing the control signal in response to the voltage level signal having a magnitude exceeding the magnitude of the second predetermined voltage reference signal. The control signal is delivered by the second voltage comparator means 40 to a signal conditioner circuit 42.

Figure 3:
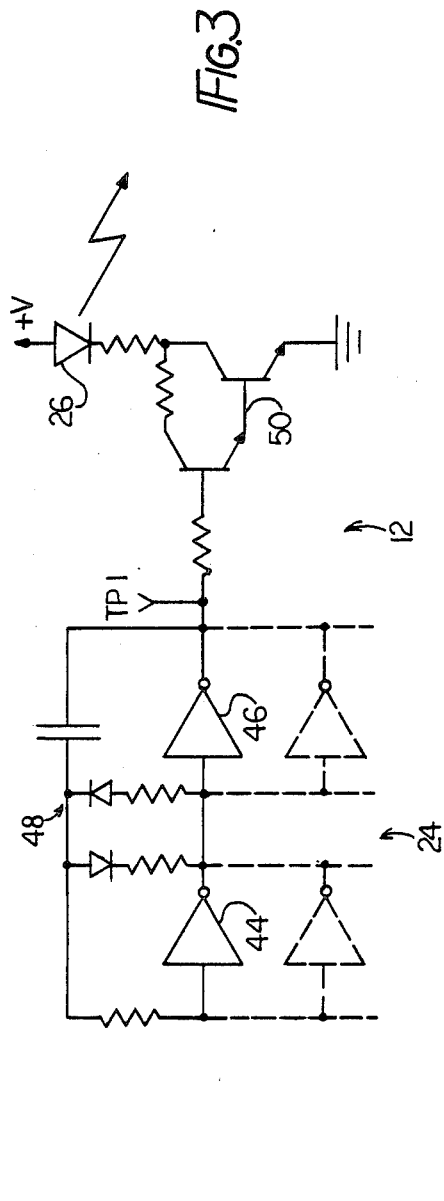
FIG. 3 is a detailed schematic diagram of the embodiment of the invention illustrated in FIG. 2.
Figure 3:
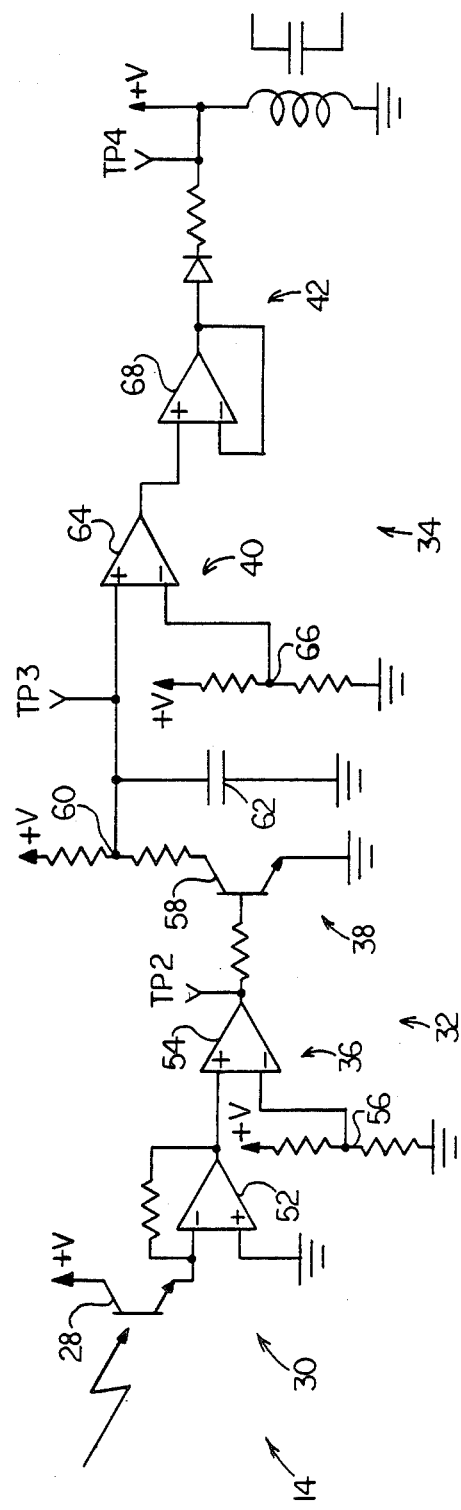

FIG. 3 illustrates a schematic diagram of an embodiment of the block diagram of FIG. 2. The emitting means 12 includes the pulse generator means 24. The pulse generator means 24 can be a conventional pulse generating arrangement, for example, a simple astable multivibrator composed of a pair of inverters 44,46 connected with a suitable feedback arrangement 48 to provide square wave pulses at TP1 at a desired frequency, for example, 100 Hertz. The current pulses are delivered to a transistor driver 50 which is serially connected with the light emitting diode 26 between supply voltage and circuit ground.

The detecting means 14 includes the phototransistor 28 connected between supply voltage and the inverting input terminal of an amplifier 52. The phototransistor 28 produces a current signal in response to the magnitude of radiant energy received. The amplifier 52 and associated components collectively comprise the current-to-voltage converter means 30 which produces a voltage signal responsive to the current signal delivered at the inverting input terminal of the amplifier 52.

This current signal is delivered from the amplifier 52 to a first input terminal of the first voltage comparator means 36. The first voltage comparator means 36 includes a comparator 54 and a voltage divider 56. The voltage divider 56 is connected to a second input terminal of the first voltage comparator means 36. An output terminal of the comparator 54 is connected to a transistor 58, which forms part of the pulse-to-level converter means 38. The transistor 58 is serially connected through a pair of resistors 60 between supply voltage and circuit ground. The junction of the pair of resistors 60 is connected through a capacitor 62 to circuit ground, and to a first input terminal of the second voltage comparator means 40.

The second voltage comparator means 40 includes a comparator 64 having a second input terminal connected to a voltage divider 66, and an output terminal connected to the signal conditioner circuit 42. The signal conditioner circuit 42 includes a buffer amplifier 68 and an output terminal TP4.

INDUSTRIAL APPLICABILITY

Operation of the apparatus 10 is best described in relation to its use on a vehicle 16, for example, an industrial vehicle such as an electric lift truck. During the following discussion, reference can be made to the waveforms in FIGS. 4 and 5 as they relate to the various test points shown in FIG. 3.

Figure 4:
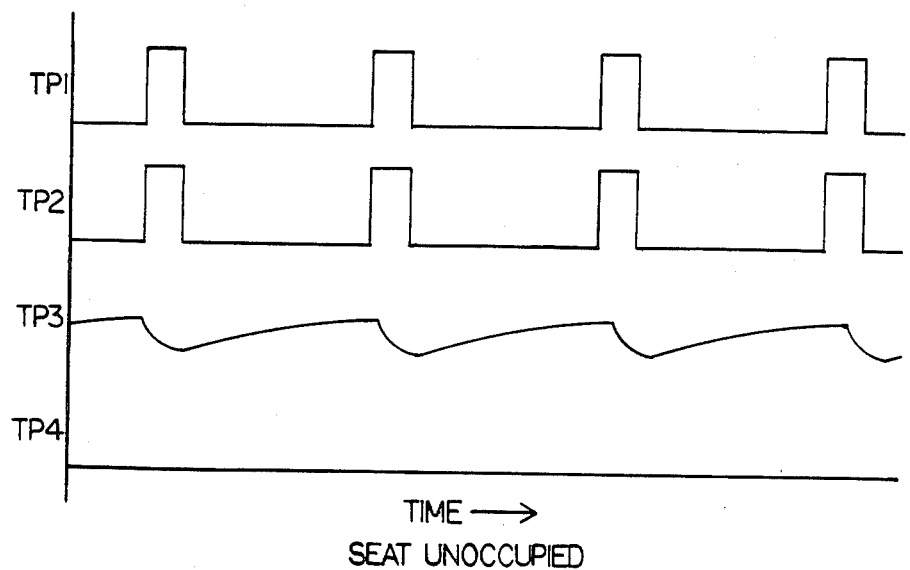
FIG. 4 illustrates waveforms associated with the embodiment of FIG. 2 when the vehicle seat is unoccupied.

Assuming first that the vehicle seat 22 is unoccupied, and that at least a portion of the coded radiant energy delivered from the emitting means 12 is received by the detecting means 14, the waveforms of FIG. 4 are applicable to the following discussion. The pulse generator means 24 substantially continuously produces the series of current pulses shown at TP1, having a predetermined frequency and duty cycle. This series of pulses is produced so long as supply voltage is connected to the apparatus 10. Each current pulse causes the transistor driver 50 to turn "on" momentarily, producing a corresponding pulse of radiant energy from the light emitting diode 26.

Owing to the fact that the seat 22 is unoccupied, the phototransistor 28 receives the coded radiant energy from the light emitting diode 26, as well as spurious, uncoded radiant energy resulting from ambient lighting conditions. The phototransistor 28 responsively delivers a current signal to the associated amplifier 52, which produces a voltage signal at the first input terminal of the first comparator means 36. The magnitude of the voltage signal produced by the amplifier 52 is responsive to the magnitude of radiant energy received by the phototransistor 28. The first comparator means 36 compares the voltage signal delivered by the amplifier 52 with the first predetermined voltage reference signal delivered by the voltage divider 56, and responsively delivers the waveform shown at TP2 to the transistor 58. The first predetermined voltage reference signal level delivered from the voltage divider 56 is selected to prevent the first comparator means 36 from producing an output signal at TP2 in response to ambient lighting conditions, and to allow the first comparator means 36 to produce an output signal at TP2 in response to the phototransistor 28 receiving the coded radiant energy.

Each voltage pulse at TP2 causes the transistor 58 to turn "on" for the duration of the pulse, thereby discharging the capacitor 62 through the transistor 58 and the associated series resistor. When the transistor 58 is turned "off", the capacitor 62 charges from the supply voltage through the associated series resistor. The charge/discharge cycle of the capacitor 62 is shown at TP3. The instantaneous voltage present on the capacitor 62 is delivered to one input terminal of the second comparator means 40, and the magnitude of this voltage is compared with the second predetermined voltage reference signal delivered to the other input terminal of the second comparator means 40 by the voltage divider 66.

Owing to the fact that the pulses received by the transistor 58 occur at regular frequent intervals, the capacitor 62 fails to charge to a voltage level sufficient to exceed the second predetermined reference voltage level from the voltage divider 66, and the output of the comparator 64 remains at a logic "0" state. This logic signal is coupled through the signal conditioner circuit 42, as shown at TP4.

For illustrative purposes, the output of the signal conditioner 42 is shown driving the coil of a relay 70. The relay 70 is part of the vehicle control circuitry and can perform whatever function is desired, for example, turning "off" the vehicle motors, engaging the vehicle brakes, etc. Alternatively, the output of the signal conditioner 42 can connect directly to a vehicle control computer or other associated device. The use to which the control signal is put in a particular instance is not part of the claimed invention.

Figure 5:
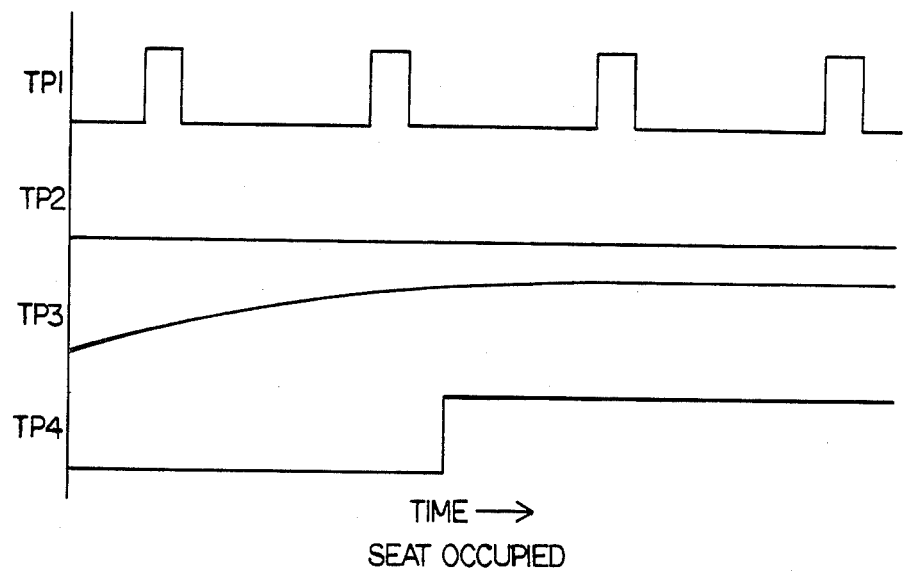
FIG. 5 illustrates waveforms associated with the embodiment of FIG. 2 when the vehicle seat is occupied.

Referring now to the waveforms of FIG. 5, in response to the vehicle seat 22 being occupied, optical communication between the emitting means 12 and detecting means 14 is interrupted by the body of the vehicle operator. Consequently, even though the light emitting diode 26 continues to produce the coded radiant energy pulses responsive to the current pulses at TP1, the coded pulses are not received by the phototransistor 28.

The amplifier 52 delivers an electrical voltage signal that is of relatively low magnitude to the first comparator means 36. The voltage signal delivered is representative only of a relatively small amount of ambient light that is received by the phototransistor 28. Responsively, the output of the comparator 54 is a logic "0" signal, as shown at TP2. Owing to the fact that the logic "0" signal at TP2 is continuous, the transistor 58 remains "off" and the capacitor 62 slowly charges to supply voltage through the associated series resistor, as shown at TP3 in FIG. 5.

Once the capacitor 62 charges to a voltage level which exceeds the magnitude of the second predetermined voltage reference signal delivered to the second comparator means 40 by the voltage divider 66, the output of the comparator 64 switches from a logic "0" to a logic "1" state, as is reflected by the control signal delivered at TP4 from the signal conditioner circuit 42. The logic "1" control signal delivered at TP4 indicates that the seat 22 is occupied and can, for example, actuate the relay 70 or be utilized in other known ways by the vehicle controller.

Therefore, the instant invention provides a reliable and inexpensive apparatus for electronically monitoring the presence and absence of an occupant in the seat 22 of a vehicle 16, while avoiding many of the problems associated with prior art devices. The presence of a box or other object on the seat 22 will not cause the apparatus 10 to be mislead into producing the occupied seat control signal unless the object is so large as to extend above the seat 22 sufficiently to block optical communication between the emitting means 12 and detecting means 14.

Other aspects, objects, advantages, and uses of this invention can be obtained from a study of the drawings, the disclosure, and the appended claims.

I claim:

1. Apparatus for producing a control signal in response to the presence and absence of an occupant in the seat of a vehicle, comprising:

emitting means for directing a source of coded radiant energy across said vehicle seat;

detecting means for receiving radiant energy, including a portion of said coded radiant energy in response to said seat being vacant, and producing an electrical signal in response to said received radiant energy;

discriminating means for distinguishing said electrical signal produced in response to said detecting means receiving said coded radiant energy, from electrical signals produced in response to said detecting means receiving spurious uncoded radiant energy; and circuit means for producing said control signal only in response to said detecting means receiving said coded radiant energy.

2. Apparatus, as set forth in claim 1, wherein one of said emitting and detecting means is located behind and above the level of said seat, and the other of said emitting and detecting means is located in front of and below the level of said seat.

3. Apparatus, as set forth in claim 1, wherein said emitting means includes pulse generator means for substantially continuously producing a series of current pulses having a predetermined frequency and duty cycle, and an infrared light emitting diode connected to said pulse generator means and adapted to produce radiant energy having a wavelength substantially within the infrared spectrum, in response to receiving each of said current pulses.

4. Apparatus, as set forth in claim 3, wherein said detecting means includes a phototransistor adapted to produce a current signal in response to receiving radiant energy, and current to voltage converter means for receiving said current signal from said phototransistor and responsively producing a voltage signal, said current to voltage converter means being connected to said phototransistor.

5. Apparatus, as set forth in claim 4, wherein said discriminating means includes first voltage comparator means for receiving said voltage signal, comparing said voltage signal with a first predetermined voltage reference signal, and producing a comparison signal in response to said voltage signal having a magnitude exceeding the magnitude of said first predetermined voltage reference signal, and pulse to level converter means for receiving said comparison signal and producing a voltage level signal in response to said received comparison signal.

6. Apparatus, as set forth in claim 5, wherein said circuit means includes second voltage comparator means for receiving said voltage level signal, comparing said voltage level signal with a second predetermined voltage reference signal, and producing a control signal in response to said voltage level signal having a magnitude exceeding the magnitude of said second predetermined voltage reference signal.

7. Apparatus for sensing the presence and absence of an occupant in the seat of a vehicle, and producing a control signal in response to the presence and absence of such occupant, comprising:

pulse generator means for substantially continuously producing a series of current pulses having a predetermined frequency and duty cycle;

a light emitting diode adapted to receive said current pulses, produce radiant energy in response to receiving each of said current pulses, and direct said produced radiant energy across said vehicle seat;

a phototransistor adapted to receive radiant energy and produce a current signal in response to said received radiant energy;

current to voltage converter means for receiving said current signal and responsively producing a voltage signal;

first voltage comparator means for receiving said voltage signal, comparing said voltage signal with a first predetermined voltage reference signal, and producing a comparison signal in response to said voltage signal having a magnitude exceeding the magnitude of said first predetermined voltage reference signal;

pulse to level converter means for receiving said comparison signal and producing a voltage level signal in response to said comparison signal; and second voltage comparator means for receiving said voltage level signal, comparing said voltage level signal with a second predetermined voltage reference signal, and producing a control signal in response to said voltage level signal having a magnitude exceeding the magnitude of said second predetermined voltage reference signal.

8. A method for sensing the presence and absence of an occupant in the seat of a vehicle, and producing a control signal in response to the presence and absence of such occupant, comprising the steps of:

directing a source of coded radiant energy across said vehicle seat;

receiving radiant energy including a portion of said coded radiant energy in response to said seat being vacant;

producing an electrical signal in response to receiving said radiant energy;

distinguishing said electrical signal produced in response to receiving said coded radiant energy, from electrical signals produced in response to receiving spurious uncoded radiant energy; and producing a control signal only in response to receiving said coded radiant energy.

* * * * *